(12) United States Patent
Sarangapani et al.

(10) Patent No.: US 12,404,598 B2
(45) Date of Patent: Sep. 2, 2025

(54) COATED WIRE

(71) Applicants: Heraeus Materials Singapore Pte. Ltd., Singapore (SG); Heraeus Deutschland Gmbh & Co. KG, Hanau (DE)

(72) Inventors: Murali Sarangapani, Singapore (SG); Yee Weon Lim, Singapore (SG); Wai Khee See Tho, Singapore (SG); Mariyappan Dhayalan, Singapore (SG); Chee Chow Tan, Singapore (SG); Juergen Scharf, Hanau (DE); Sungsig Kang, Singapore (SG)

(73) Assignees: HERAEUS ELECTRONICS GMBH & CO. KG, Hanau (DE); HERAEUS MATERIALS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 18/263,655

(22) PCT Filed: Feb. 5, 2021

(86) PCT No.: PCT/SG2021/050060
§ 371 (c)(1),
(2) Date: Jul. 31, 2023

(87) PCT Pub. No.: WO2022/169407
PCT Pub. Date: Aug. 11, 2022

(65) Prior Publication Data
US 2024/0084472 A1    Mar. 14, 2024

(51) Int. Cl.
| C25D 5/12 | (2006.01) |
| C25D 3/12 | (2006.01) |
| C25D 3/48 | (2006.01) |
| C25D 3/50 | (2006.01) |
| C25D 5/16 | (2006.01) |
| C25D 5/50 | (2006.01) |
| C25D 7/06 | (2006.01) |

(52) U.S. Cl.
CPC ............... *C25D 5/12* (2013.01); *C25D 3/12* (2013.01); *C25D 3/48* (2013.01); *C25D 3/50* (2013.01); *C25D 5/16* (2013.01); *C25D 5/50* (2013.01); *C25D 7/0607* (2013.01)

(58) Field of Classification Search
None
See application file for complete search history.

(56) References Cited

U.S. PATENT DOCUMENTS

2016/0086909 A1* 3/2016 Garlock ............... H01L 24/78
                                                                257/784
2017/0125315 A1    5/2017 Wood et al.

FOREIGN PATENT DOCUMENTS

| CN | 105321917 A | 2/2016 | |
| CN | 108290254 A | 7/2018 | |
| KR | 20160098397 A | 8/2016 | |
| SG | 10201505546Y A | 2/2016 | |
| TW | 201134561 A | 10/2011 | |
| WO | 2015074703 A1 | 5/2015 | |
| WO | WO-2017091144 A1 * | 6/2017 | ........... B23K 20/007 |
| WO | 2020/218969 A1 | 10/2020 | |

* cited by examiner

Primary Examiner — Daniel J. Schleis
(74) Attorney, Agent, or Firm — Blank Rome LLP

(57) ABSTRACT

A wire comprising a wire core with a surface, the wire core having a coating layer superimposed on its surface, wherein the wire core itself is a silver-based wire core, wherein the coating layer is a double-layer comprised of a 1 to 100 nm thick inner layer of nickel or palladium and an adjacent 1 to 250 nm thick outer layer of gold, characterized in that the wire exhibits a total carbon content of ≤40 wt.-ppm.

17 Claims, No Drawings

COATED WIRE

The invention relates to a coated wire comprising a silver-based wire core and a coating layer superimposed on the surface of the wire core. The invention further relates to a process for manufacturing such coated wire.

The use of bonding wires in electronics and microelectronics applications is well-known state of the art. While bonding wires were made from gold in the beginning, nowadays less expensive materials are used such as copper, copper alloys, silver and silver alloys. Such wires may have a metal coating.

With respect to wire geometry, most common are bonding wires of circular cross-section and bonding ribbons which have a more or less rectangular cross-section. Both types of wire geometries have their advantages making them useful for specific applications.

It is an object of the invention to provide a coated silver-based wire suitable for use in wire bonding applications, having outstanding wire pulling properties and thus allowing higher bonding speed as well as difficult wire loop shapes.

A contribution to the solution of said object is provided by the subject-matter of the category-forming claims. The dependent sub-claims of the category-forming claims represent preferred embodiments of the invention.

In a first aspect, the invention relates to a wire comprising a wire core (hereinafter also called "core" for short) with a surface, the wire core having a coating layer superimposed on its surface, wherein the wire core itself is a silver-based wire core, wherein the coating layer is a double-layer comprised of a 1 to 100 nm thick inner layer of nickel or palladium and an adjacent 1 to 250 nm thick outer layer of gold, characterized in that the wire exhibits a total carbon (TC) content of ≤40 wt.-ppm (weight-ppm).

The wire of the invention is preferably a bonding wire for bonding in microelectronics. It is preferably a one-piece object. Numerous shapes are known and appear useful for wires of the invention. Preferred shapes are—in cross-sectional view—round, ellipsoid and rectangular shapes. For the invention, the term "bonding wire" comprises all shapes of cross-sections and all usual wire diameters, though bonding wires with circular cross-section and thin diameters are preferred. The average cross-section is in the range of for example from 50 to 5024 $\mu m^2$ or preferably 110 to 2400 $\mu m^2$; accordingly in case of the preferred circular cross-sections, the average diameter is in the range of, for example, from 8 to 80 µm or preferably 12 to 55 µm.

The average diameter or, simply stated, the diameter of a wire or wire core can be obtained by the "sizing method". According to this method the physical weight of the wire for a defined length is determined. Based on this weight, the diameter of a wire or wire core is calculated using the density of the wire material. The diameter is calculated as arithmetic mean of five measurements on five cuts of a particular wire.

The wire core is a silver-based wire core; i.e. the wire core consists of a silver-based material in the form of (a) doped silver, (b) a silver alloy or (c) a doped silver alloy.

The term "doped silver" used herein means a silver-based material consisting of (a1) silver in an amount in the range of from >99.49 to 99.997 wt.-% (weight-%), (a2) at least one doping element other than silver in a total amount of from 30 to <5000 wt.-ppm and (a3) further components (components other than silver and the at least one doping element) in a total amount of from 0 to 100 wt.-ppm. In a preferred embodiment, the term "doped silver" used herein means doped silver consisting of (a1) silver in an amount in the range of from >99.49 to 99.997 wt.-%, (a2) at least one doping element selected from the group consisting of calcium, nickel, platinum, palladium, gold, copper, rhodium, and ruthenium in a total amount of from 30 to <5000 wt.-ppm and (a3) further components (components other than silver, calcium, nickel, platinum, palladium, gold, copper, rhodium, and ruthenium) in a total amount of from 0 to 100 wt.-ppm.

The term "silver alloy" used herein means a silver-based material consisting of (b1) silver in an amount in the range of from 89.99 to 99.5 wt.-%, preferably 97.99 to 99.5 wt.-%, (b2) at least one alloying element in a total amount in the range of from 0.5 to 10 wt.-%, preferably 0.5 to 2 wt.-% and (b3) further components (components other than silver and the at least one alloying element) in a total amount of from 0 to 100 wt.-ppm. In a preferred embodiment, the term "silver alloy" used herein means a silver alloy consisting of (b1) silver in an amount in the range of from 89.99 to 99.5 wt.-%, preferably 97.99 to 99.5 wt.-%, (b2) at least one alloying element selected from the group consisting of nickel, platinum, palladium, gold, copper, rhodium, and ruthenium in a total amount in the range of from 0.5 to 10 wt.-%, preferably 0.5 to 2 wt.-% and (b3) further components (components other than silver, nickel, platinum, palladium, gold, copper, rhodium, and ruthenium) in a total amount of from 0 to 100 wt.-ppm.

The term "doped silver alloy" used herein means a silver-based material consisting of (c1) silver in an amount in the range of from >89.49 to 99.497 wt.-%, preferably 97.49 to 99.497 wt.-%, (c2) at least one doping element in a total amount of from 30 to <5000 wt.-ppm, (c3) at least one alloying element in a total amount in the range of from 0.5 to 10 wt.-%, preferably 0.5 to 2 wt.-% and (c4) further components (components other than silver, the at least one doping element and the at least one alloying element) in a total amount of from 0 to 100 wt.-ppm, wherein the at least one doping element (c2) is other than the at least one alloying element (c3). In a preferred embodiment, the term "doped silver alloy" used herein means a doped silver alloy consisting of (c1) silver in an amount in the range of from >89.49 to 99.497 wt.-%, preferably 97.49 to 99.497 wt.-%, (c2) at least one doping element selected from the group consisting of calcium, nickel, platinum, palladium, gold, copper, rhodium, and ruthenium in a total amount of from 30 to <5000 wt.-ppm, (c3) at least one alloying element selected from the group consisting of nickel, platinum, palladium, gold, copper, rhodium and ruthenium in a total amount in the range of from 0.5 to 10 wt.-%, preferably 0.5 to 2 wt.-% and (c4) further components (components other than silver, calcium, nickel, platinum, palladium, gold, copper, rhodium and ruthenium) in a total amount of from 0 to 100 wt.-ppm, wherein the at least one doping element (c2) is other than the at least one alloying element (c3).

This disclosure mentions "further components" and "doping elements". The individual amount of any further component is less than 30 wt.-ppm. The individual amount of any doping element is at least 30 wt.-ppm. All amounts in wt.-% and wt.-ppm are based on the total weight of the core or its precursor item or elongated precursor item.

The core of the wire of the invention may comprise so-called further components in a total amount in the range of from 0 to 100 wt.-ppm, for example, 10 to 100 wt.-ppm. In the present context, the further components, often also referred as "inevitable impurities", are minor amounts of chemical elements and/or compounds which originate from impurities present in the raw materials used or from the wire core manufacturing process. The low total amount of 0 to 100 wt.-ppm of the further components ensures a good reproducibility of the wire properties. Further components present in the core are usually not added separately. Each individual further component is comprised in an amount of less than 30 wt.-ppm, based on the total weight of the wire core.

The core of the wire is a homogeneous region of bulk material. Since any bulk material always has a surface region which might exhibit different properties to some extent, the properties of the core of the wire are understood as properties of the homogeneous region of bulk material. The surface of the bulk material region can differ in terms of morphology, composition (e.g. sulfur, chlorine and/or oxygen content) and other features. The surface is an interface region between the wire core and the coating layer superimposed on the wire core. Typically, the coating layer is completely superimposed on the wire core's surface. In the region of the wire between its core and the coating layer superimposed thereon a combination of materials of both, the core and the coating layer, can be present.

The coating layer superimposed on the surface of the wire core is a double-layer comprised of a 1 to 100 nm thick, preferably 1 to 30 nm thick inner layer of nickel or palladium and an adjacent 1 to 250 nm thick, preferably 20 to 200 nm thick outer layer of gold. In this context the term "thick" or "coating layer thickness" means the size of the coating layer in perpendicular direction to the longitudinal axis of the core.

In an embodiment, the outer gold layer comprises at least one member selected from the group consisting of antimony, bismuth, arsenic and tellurium in a total proportion in the range of 10 to 100 wt.-ppm, preferably 10 to 40 wt.-ppm, based on the weight of the wire (wire core plus the double-layer coating). At the same time, in an embodiment, the total proportion of said at least one member may be in the range of 300 to 3500 wt.-ppm, preferably 300 to 2000 wt.-ppm, most preferably 600 to 1000 wt.-ppm, based on the weight of the gold of the gold layer. In a variant of this embodiment it is preferred that antimony is present within the gold layer. It is even more preferred that antimony is alone present within the gold layer, i.e. without the simultaneous presence of bismuth, arsenic and tellurium. In other words, in a preferred variant of the embodiment, the gold layer comprises antimony in a proportion in the range of 10 to 100 wt.-ppm, preferably 10 to 40 wt.-ppm, based on the weight of the wire (wire core plus the double-layer coating), without bismuth, arsenic and tellurium being present within the gold layer; at the same time, in an even more preferred embodiment, the proportion of the antimony may be in the range of 300 to 3500 wt.-ppm, preferably 300 to 2000 wt.-ppm, most preferably 600 to 1000 wt.-ppm, based on the weight of the gold of the gold layer. In an embodiment, the at least one member selected from the group consisting of antimony, bismuth, arsenic and tellurium may exhibit a concentration gradient within the gold layer, said gradient increasing in the direction towards the wire core, i.e. in perpendicular direction to the longitudinal axis of the wire core. It is unknown in what chemical form or as what chemical species said at least one member is present in the gold layer, i.e. whether it is present in the gold layer in elemental form or in the form of a chemical compound.

It is essential, that the wire of the invention exhibits a total carbon content of ≤40 wt.-ppm; i.e. a total carbon content of ≤40 wt.-ppm based on the weight of the wire (wire core plus the double-layer coating). In other words, the wire's total carbon content is in the range of 0 to 40 wt.-ppm; preferably it is in the range of 10 to 30 wt.-ppm. The total carbon content can be determined according to ASTM E1019 as described below, Analytical Method A. In a preferred embodiment, the wire of the invention exhibits a carbon content of ≤3 mg carbon per square meter of the wire surface, i.e. the wire's gold layer surface. In other words, it is preferred, that the carbon content of the wire surface is in the range of 0 to 3 mg carbon per square meter of the wire surface; 0.5 to 2.5 mg carbon per square meter of the wire surface are preferred with 0.5 to 2 mg carbon per square meter of the wire surface being even more preferred. The carbon content of the wire surface can be determined by instrumental gas analysis as described below, Analytical Method B.

Unless otherwise noted, all standards cited herein are the current version at the time of the filing date.

The determination of the total carbon content as well as the determination of the carbon content of the wire surface are quantitative analysis methods; both do not allow for determination of the carbon's chemical nature. It is hence unknown in what chemical form or as what chemical species the carbon is present.

If the total carbon content of the wire exceeds the upper limit of 40 wt.-ppm it appears that the wire becomes "sticky" resulting in a weakening of wire pulling properties and in that the wire does not freely unwind from the wire spool. This causes undesired and unacceptable stoppages of the wire bonding process, so-called bonder stoppages. The situation becomes even worse if the carbon content of the wire surface exceeds the upper limit of 3 mg carbon per square meter.

It is assumed that the total carbon, if any, may stem (i) from an auxiliary agent such as, for example, conventional drawing lubricant used during below-mentioned elongation process steps (2) and/or (4) and/or in particular (ii) from at least one quenching additive which may be used during below-mentioned quenching sub-step of process step (5).

This disclosure mentions "at least one quenching additive". The at least one quenching additive comprises carbon and it may in particular be selected from the group consisting of anionic surfactants and of water-soluble organic solvents. Anionic surfactants are characterized by a negatively charged hydrophilic polar group attached to a hydrophobic residue, for example, a carboxylate group, a sulfate group or a sulfonate group directly attached or attached via a linking group to a long-chain hydrocarbyl residue. Examples of such anionic surfactants include in particular corresponding alkali (sodium or potassium) salts or $NH_4$-salts, like, for example, ammonium lauryl sulfate, sodium laureth sulfate, sodium lauryl sarcosinate, sodium myreth sulfate, sodium pareth sulfate, sodium stearate, sodium lauryl sulfate, and ammonium laureth sulfate. Examples of water-soluble organic solvents include in particular alcohols like methanol, ethanol, n-propanol and isopropanol, and water-soluble glycol ethers.

It is further assumed that carbon of the wire surface, if any, may stem from said at least one quenching additive which may be used during below-mentioned quenching sub-step of process step (5).

It has been found, that said use of auxiliary agent like conventional drawing lubricant has only some influence on the total carbon content and on the carbon content of the wire surface; i.e. said use of conventional drawing lubricant is acceptable and does not lead to an exceedance of said total carbon content threshold and of said wire surface carbon content threshold. However, the at least one quenching additive which may be used during below-mentioned quenching sub-step of process step (5) has a stronger influence and it has been found that its amount shall not exceed a certain threshold within any aqueous quenching solution used during below-mentioned quenching sub-step of process step (5). Hence, it is important to perform the below-mentioned quenching sub-step of process step (5) with water as carbon-free quenching medium or, preferably, with a quenching medium in the form of an aqueous quenching solution comprising or consisting of water and at least one quenching additive, the latter being present in an amount resulting in a total organic carbon (TOC) content of the aqueous quenching solution of ≤10 mg per liter; a total organic carbon content of the aqueous quenching solution in the range of >0.0001 to 10 mg per liter is preferred with the range of >0.001 to 10 mg per liter being even more preferred.

The total organic carbon content of the aqueous quenching solution can be determined according to ASTM D7573 as described below, Analytical Method C.

In another aspect, the invention relates also to a process for the manufacture of the coated wire of the invention in any of its embodiments disclosed above. The process comprises at least the steps (1) to (5):
  (1) providing a silver-based precursor item,
  (2) elongating the precursor item to form an elongated precursor item, until an intermediate cross-section in the range of from 706 to 31400 $\mu m^2$ or an intermediate diameter in the range of from 30 to 200 $\mu m$ is obtained,
  (3) applying a double-layer coating of an inner layer of nickel or palladium and an adjacent outer layer of gold on the surface of the elongated precursor item obtained after completion of process step (2),
  (4) further elongating the coated precursor item obtained after completion of process step (3) until a desired final cross-section or diameter and a double-layer comprised of an inner layer of nickel or palladium having a desired final thickness in the range of 1 to 100 nm and an adjacent outer layer of gold having a desired final thickness in the range of 1 to 250 nm is obtained, and
  (5) finally strand annealing the coated precursor obtained after completion of process step (4) at an oven set temperature in the range of from 200 to 600° C. for an exposure time in the range of from 0.4 to 0.8 seconds and quenching it to form the coated wire,
  wherein step (2) may include one or more sub-steps of intermediate batch annealing of the precursor item at an oven set temperature of from 400 to 800° C. for an exposure time in the range of from 50 to 150 minutes, and
  wherein the application of the gold layer in step (3) is performed by electroplating it from a gold electroplating bath comprising gold.

The term "strand annealing" is used herein. It is a continuous process allowing for a fast production of a wire with high reproducibility. In the context of the invention, strand annealing means that the annealing is done dynamically while the coated precursor to be annealed is pulled or moved through a conventional annealing oven and spooled onto a reel after having left the annealing oven. Here, the annealing oven is typically in the form of a cylindrical tube of a given length. With its defined temperature profile at a given annealing speed which may be chosen in the range of, for example, from 10 to 60 meters/minute the annealing time/oven temperature parameters can be defined and set.

The term "oven set temperature" is used herein. It means the temperature fixed in the temperature controller of the annealing oven. The annealing oven may be a chamber furnace type oven (in case of batch annealing) or a tubular annealing oven (in case of strand annealing).

This disclosure distinguishes between precursor item, elongated precursor item, coated precursor item, coated precursor and coated wire. The term "precursor item" is used for those wire pre-stages which have not reached the desired final cross-section or final diameter of the wire core, while the term "precursor" is used for a wire pre-stage at the desired final cross-section or the desired final diameter. After completion of process step (5), i.e. after the final strand annealing of the coated precursor at the desired final cross-section or the desired final diameter a coated wire in the sense of the invention is obtained.

The precursor item as provided in process step (1) is a silver-based precursor item; i.e. the precursor item consists of (a) doped silver, (b) a silver alloy or (c) a doped silver alloy. As regards the meaning of the terms "doped silver", "silver alloy" and "doped silver alloy" reference is made to the afore made disclosure.

A silver-based precursor item can be obtained by alloying, doping or alloying and doping silver with the desired amount of the required components. The doped silver or silver alloy or doped silver alloy can be prepared by conventional processes known to the person skilled in the art of metal alloys, for example, by melting together the components in the desired proportional ratio. In doing so, it is possible to make use of one or more conventional master alloys. The melting process can for example be performed making use of an induction furnace and it is expedient to work under vacuum or under an inert gas atmosphere. The materials used can have a purity grade of, for example, 99.99 wt.-% and above. The melt so-produced can be cooled to form a homogeneous piece of silver-based precursor item. Typically, such precursor item is in the form of a rod having a diameter of, for example, 2 to 25 mm and a length of, for example, 2 to 100 m. Such rod can be made by continuous casting the silver-based melt using an appropriate mold, followed by cooling and solidifying.

In process step (2) the precursor item is elongated to form an elongated precursor item, until an intermediate cross-section in the range of from 706 to 31400 $\mu m^2$ or an intermediate diameter in the range of from 30 to 200 $\mu m$ is obtained. Techniques to elongate a precursor item are known and appear useful in the context of the invention. Preferred techniques are rolling, swaging, die drawing or the like, of which die drawing is particularly preferred. In the latter case the precursor item is drawn in several process steps until the desired intermediate cross-section or the desired intermediate diameter is reached. Such wire die drawing process is well known to the person skilled in the art. Conventional tungsten carbide and diamond drawing dies may be employed and auxiliary agents like conventional drawing lubricants may be employed to support the drawing.

Step (2) of the process of the invention may include one or more sub-steps of intermediate batch annealing of the elongated precursor item at an oven set temperature in the range of from 400 to 800° C. for an exposure time in the range of from 50 to 150 minutes. Said optional intermediate batch annealing may be performed, for example, with a rod drawn to a diameter of 2 mm and coiled on a drum.

The optional intermediate batch annealing of process step (2) may be performed under an inert or reducing atmosphere. Numerous types of inert atmospheres as well as reducing atmospheres are known in the art and are used for purging the annealing oven. Of the known inert atmospheres, nitrogen or argon is preferred. Of the known reducing atmospheres, hydrogen is preferred. Another preferred reducing atmosphere is a mixture of hydrogen and nitrogen. Preferred mixtures of hydrogen and nitrogen are 90 to 98 vol.-% nitrogen and, accordingly, 2 to 10 vol.-% hydrogen, wherein the vol.-% total 100 vol.-%. Preferred mixtures of nitrogen/hydrogen are equal to 93/7, 95/5 and 97/3 vol.-%/vol.-%, each based on the total volume of the mixture.

In process step (3) a coating in the form of a double-layer coating of an inner layer of nickel or palladium and an adjacent outer layer of gold is applied on the surface of the elongated precursor item obtained after completion of process step (2) so as to superimpose the coating over said surface.

The skilled person knows how to calculate the thickness of such coating on an elongated precursor item to finally obtain the coating in the layer thickness disclosed for the embodiments of the wire, i.e. after finally elongating the coated precursor item. The skilled person knows numerous techniques for forming a coating layer of a material according to the embodiments on a silver-based surface. Preferred techniques are plating, such as electroplating and electroless plating, deposition of the material from the gas phase such as sputtering, ion plating, vacuum evaporation and physical vapor deposition, and deposition of the material from the melt. In case of applying said double-layer comprised of inner nickel or palladium layer and outer gold layer, it is preferred to apply the nickel or palladium layer by electroplating.

The gold layer is applied by electroplating. Gold electroplating is performed making use of a gold electroplating bath, i.e. an electroplating bath that allows for a nickel or palladium cathode surface to be electroplated with gold. In other words, the gold electroplating bath is a composition allowing for direct application of gold in elemental, metallic form onto a nickel or a palladium surface wired as cathode. The gold electroplating bath comprises gold and preferably also at least one member selected from the group consisting of antimony, bismuth, arsenic and tellurium; hence, the gold electroplating bath is preferably a composition allowing for the deposition of not only the elemental gold but preferably also allowing for depositing said at least one member selected from the group consisting of antimony, bismuth, arsenic and tellurium within the gold layer. It is unknown what chemical species said at least one member is, i.e. whether it is present in the gold layer in elemental form or as a chemical compound. A preferred gold electroplating bath can be made by adding said at least one member in a suitable chemical form to an aqueous composition containing gold as dissolved salt or dissolved salts. Examples of such aqueous compositions into which the at least one member can be added are Aurocor® K 24 HF made by Atotech and Auruna® 558 and Auruna® 559 made by Umicore. Alternatively, one can use a gold electroplating bath which already comprises at least one member selected from the group consisting of antimony, bismuth, arsenic and tellurium, like for example MetGold Pure ATF made by Metalor. The concentration of the gold in the gold electroplating bath can be in the range of, for example, 8 to 40 g/l (grams per liter), preferably 10 to 20 g/l. The concentration of the at least one member selected from the group consisting of antimony, bismuth, arsenic and tellurium in the preferred gold electroplating bath can be in the range of, for example, 15 to 50 wt.-ppm, preferably 15 to 35 wt.-ppm.

Electroplating application of the gold layer is performed by guiding the nickel- or palladium-coated elongated precursor item wired as a cathode through the gold electroplating bath. The so obtained gold-coated precursor item exiting the gold electroplating bath may be rinsed and dried before process step (4) is performed. The use of water as a rinsing medium is expedient, with alcohol and alcohol/water mixtures being further examples of rinsing media. The gold electroplating of the nickel- or palladium-coated elongated precursor item passing through the gold electroplating bath can take place at a direct voltage in the range of, for example, 0.2 to 20 V at a current in the range of, for example, 0.001 to 5 A, in particular 0.001 to 1 A or 0.001 to 0.2 A. Typical contact times may be in the range of, for example, 0.1 to 30 seconds, preferably 2 to 8 seconds. The current densities used in this context can be in the range of, for example, 0.01 to 150 A/dm$^2$. The gold electroplating bath may have a temperature in the range of, for example, 45 to 75° C., preferably 55 to 65° C.

The thickness of the gold coating layer can be adjusted as desired essentially via the following parameters: chemical composition of the gold electroplating bath, contact time of the elongated precursor item with the gold electroplating bath, current density. In this context, the thickness of the gold layer can generally be increased by increasing the concentration of the gold in the gold electroplating bath, by increasing the contact time of the elongated precursor item wired as cathode and the gold electroplating bath, and by increasing the current density.

In process step (4) the coated precursor item obtained after completion of process step (3) is further elongated until (4) a desired final cross-section or diameter of the wire having a double-layer comprised of an inner layer of nickel or palladium having a desired final thickness in the range of 1 to 100 nm, preferably 1 to 30 nm, and an adjacent outer layer of gold having a desired final thickness in the range of 1 to 250 nm, preferably 20 to 200 nm, is obtained. Techniques to elongate the coated precursor item are the same elongation techniques like those mentioned above in the disclosure of process step (2).

Process step (5) comprises a strand-annealing sub-step and a quenching sub-step. In process step (5) the coated precursor obtained after completion of process step (4) is finally strand annealed at an oven set temperature in the range of from 200 to 600° C., preferably 350 to 500° C. for an exposure time in the range of from 0.4 to 0.8 seconds and quenched to form the coated wire. The finally strand annealed coated precursor, i.e. the still hot coated wire is quenched in water or, preferably, in an aqueous quenching solution comprising or consisting of water and at least one quenching additive, the latter being present in an amount resulting in a total organic carbon content of the aqueous quenching solution of ≤10 mg per liter; a total organic carbon content of the aqueous quenching solution in the range of >0.0001 to 10 mg per liter is preferred with the range of >0.001 to 10 mg per liter being even more preferred. The quenching means immediately or rapidly, i.e. within 0.2 to 0.6 seconds, cooling the finally strand annealed coated precursor from the temperature it experienced in process step (5) down to room temperature, for example by dipping or dripping.

After completion of the strand annealing and the quenching of process step (5) the coated wire of the invention is finished. In order to fully benefit from its properties, it is expedient to either use it immediately for wire bonding applications, i.e. without delay, for example, within no longer than 28 days after completion of process step (5). Alternatively, in order to keep the wire's wide wire bonding process window property and in order to prevent it from oxidative or other chemical attack, the finished wire is typically spooled and vacuum sealed immediately after completion of process step (5), i.e. without delay, for example, within <1 to 5 hours after completion of process step (5) and then stored for further use as bonding wire. Storage in vacuum sealed condition should not exceed 12 months. After opening the vacuum seal, the wire should be used for wire bonding within no longer than 28 days.

It is preferred that all process steps (1) to (5) as well as spooling and vacuum sealing are carried out under clean room conditions (US FED STD 209E cleanroom standards, 1 k standard).

A third aspect of the invention is a coated wire obtainable by the afore disclosed process according to any embodiment thereof. It has been found that the coated wire of the invention is well suited for use as a bonding wire in wire bonding applications.

EXAMPLES

Analytical Methods A. to C.

A. Determination of the Total Carbon Content of Wire

The total carbon (TC) content of the wire was determined based on ASTM E 1019 using a CS 844 analyzer from LECO. For each analysis 0.5 g of the respective wire and 1.5 g of Leco Cu-Accelerator were placed in a crucible made of aluminum oxide. The crucible was heated to 1500° C. for 45 s in a stream of oxygen (3 l/min) to oxidize the carbon in the wire. The oxidized carbon was detected via infrared absorption.

B. Determination of the Carbon Content of the Wire Surface

The carbon content of the wire surface was determined using a RC 612 Multiphase Determinator from LECO. A piece of wire exhibiting a surface area of 0.22 $dm^2$ was placed in a nickel crucible and heated in a stream of oxygen (0.5 l/min) at 600° C. for 120 s. Oxidized carbon was detected via infrared absorption.

C. Determination of the Total Organic Carbon (TOC) Content of an Aqueous Quenching Solution TOC is determined by ASTM D7573.

Wire Ball-Wedge Bonding Procedure and Evaluation of Bonder Stoppage

Ball-wedge bonding has multiple steps: first EFO firing, melting of wire tip, formation of free air ball (FAB), first bond (ball bond) to bond pad, looping, second bond (wedge bond or stitch bond) on substrate or plated fingers, tail cut of wire.

Here, the FAB descended to an Al-0.5 wt.-% Cu bond pad from a predefined height (tip of 203.2 μm) and speed (contact velocity of 6.4 μm/sec). Upon touching the bond pad, a set of defined bonding parameters (bond force of 100 g, ultrasonic energy of 95 mA and bond time of 15 ms) took into effect to deform the FAB and to form the bonded ball. After forming the bonded ball, the capillary rose to a predefined height (kink height of 152.4 μm and loop height of 254 μm) to form the loop. After forming the loop, the capillary descended to the lead to form the stitch. After forming the stitch, the capillary rose, and the wire clamp closed to cut the wire to make the predefined tail length (tail length extension of 254 μm). For each sample a meaningful number of 1250 wires were bonded.

Evaluation of Bonder Stoppages:

Poor: ≥1 bonder stoppage during formation of 1250 wire bonds. Unwinding of the wire from the spool is difficult, or the length of tail cut portion is inconsistent leading to short tail, which means that there is not enough wire left for EFO firing and the bonder is stopping. This is disadvantageous, because threading the wire needs to be carried out to restart the bonding cycle.

Good: zero bonder stoppage during formation of 1250 wire bonds

Wire Examples 1 to 8

98.5 wt.-% of silver (Ag) and 1.5 w.-t % of palladium (Pd), each exhibiting at least 99.99 wt.-% purity ("4N"), were melted in a crucible. Then a wire core precursor item in the form of 8 mm rods was continuous cast from the melt. The rods were then drawn in several drawing steps to form a wire core precursor having a circular cross-section with a diameter of 2 mm. The wire core precursor was intermediate batch annealed at an oven set temperature of 500° C. for an exposure time of 60 minutes. The rods were further drawn in several drawing steps to form a wire core precursor having a circular cross-section with a diameter of 46 μm. The wire core precursor was then electroplated with a double-layer coating of an inner layer of nickel and an adjacent outer layer of gold. To this end, the wire core precursor while being wired as cathode was moved through a 60° C. warm nickel electroplating bath and, subsequently, through a 61° C. warm gold electroplating bath. The nickel electroplating bath comprised 90 g/l (grams per liter) $Ni(SO_3NH_2)_2$, 6 g/l $NiCl_2$ and 35 g/l $H_3BO_3$, whereas the gold electroplating bath (based on MetGold Pure ATF from Metalor) had a gold content of 13.2 g/l and an antimony content of 20 wt.-ppm.

Thereafter the coated wire precursor was further drawn to a final diameter of 20 μm, followed by a final strand annealing at an oven set temperature of 430° C. for an exposure time of 0.6 seconds, immediately followed by quenching the so-obtained coated wires in water (deionized water type II from Bestchem) or in an aqueous quenching solution (deionized water type II from Bestchem plus isopropanol and/or anionic surfactant (sodium stearate)) as shown in Table 1. The contact time of each wire with the aqueous quenching solution was 0.3 s. After quenching the wires were spooled at 300 m length.

The 20 μm thick wires had an 9 nm thick inner layer of nickel and an adjacent outer 90 nm thick layer of gold.

TABLE 1

| Ex. | Anionic surfactant | Isopropanol | TOC of aqueous quenching solution [mg/l] | TC of wire [wt.-ppm] | Carbon content of wire surface [mg/m$^2$] | No of Bonding Stoppages |
|---|---|---|---|---|---|---|
| 1 | ./. | ./. | <0.5 | 21.5 | 0.8 | 0 |
| 2 | + | ./. | 1.1 | 23.1 | 1.2 | 0 |
| 3 | + | ./. | 4.3 | 25.0 | 1.4 | 0 |
| 4 | + | + | 6.8 | 26.5 | 1.5 | 0 |
| 5 | ./. | + | 9.3 | 28.9 | 1.7 | 0 |

TABLE 1-continued

| Ex. | Anionic surfactant | Isopropanol | TOC of aqueous quenching solution [mg/l] | TC of wire [wt.-ppm] | Carbon content of wire surface [mg/m$^2$] | No of Bonding Stoppages |
|---|---|---|---|---|---|---|
| 6 | + | + | 67.4 | 45.5 | 2.5 | 7 |
| 7 | + | + | 335.7 | 67.0 | 3.3 | 23 |
| 8 | + | + | 685.1 | 99.5 | 5.3 | 59 |

Examples 1 to 5: according to the invention
Examples 6 to 8: comparative examples

The invention claimed is:

1. A wire comprising a wire core with a surface, the wire core having a coating layer superimposed on the wire core surface, wherein
the wire core is a silver-based wire core, the silver-based wire core consisting of a silver-based material in the form of a doped silver, a silver alloy, or a doped silver alloy,
the coating layer is a double-layer consisting of a 1 to 30 nm thick inner layer of nickel and an adjacent 20 to 200 nm thick outer layer of gold,
the wire exhibits a total carbon content of ≤40 wt.-ppm, and
the carbon content of the wire surface is in a range from 0.5 to less than 2.5 mg of carbon per square meter.

2. The wire of claim 1, wherein the wire has an average cross-section ranging from 50 to 5024 μm$^2$.

3. The wire of claim 1, wherein the wire has a circular cross-section with an average diameter ranging from 8 to 80 μm.

4. The wire of claim 1, wherein the outer layer of gold comprises at least one member selected from the group consisting of antimony, bismuth, arsenic and tellurium in a total proportion ranging from 10 to 100 wt.-ppm based on the weight of the wire.

5. The wire of claim 1, wherein outer layer of gold comprises at least one member selected from the group consisting of antimony, bismuth, arsenic and tellurium in a total proportion ranging from 300 to 3500 wt.-ppm based on the weight of the gold of the outer layer.

6. The wire of claim 1, wherein the wire exhibits a total carbon content ranging from 10 to 30 wt.-ppm.

7. The wire of claim 4, wherein the at least one member is antimony.

8. The wire of claim 4, wherein the at least one member selected from the group consisting of antimony, bismuth, arsenic and tellurium is present in the outer layer of gold in a concentration gradient that increases in a direction perpendicular to the longitudinal axis of the wire core.

9. The wire of claim 1, wherein the carbon is a remnant of an auxiliary agent used during a process of manufacturing the wire.

10. The wire of claim 9, wherein the auxiliary agent is a drawing lubricant, a quenching additive, or a combination thereof.

11. A wire comprising a wire core with a surface, the wire core having a coating layer superimposed on the wire core surface, wherein
the wire core is a silver-based wire core,
the coating layer is a double-layer comprised of a 1 to 100 nm thick inner layer of nickel or palladium and an adjacent 1 to 250 nm thick outer layer of gold,
the wire exhibits a total carbon content of ≤40 wt.-ppm,
the outer layer of gold comprises at least one member selected from the group consisting of antimony, bismuth, arsenic and tellurium in a total proportion ranging from 10 to 100 wt.-ppm based on the weight of the wire, wherein the at least one member selected from the group consisting of antimony, bismuth, arsenic and tellurium is present in the outer layer of gold in a concentration gradient that increases in a direction perpendicular to the longitudinal axis of the wire core.

12. The wire of claim 11, wherein the carbon content of the wire core surface is in a range from 0.5 to less than 2.5 mg of carbon per square meter.

13. The wire of claim 11, wherein the coating layer is a double-layer consisting of a 1 to 100 nm thick inner layer of nickel and an adjacent 1 to 250 nm thick outer layer of gold.

14. The wire of claim 1, wherein the wire exhibits a total carbon content of 10-30 wt.-ppm.

15. The wire of claim 1, wherein the carbon content of the wire surface is in a range from about 0.8 to about 1.7 mg of carbon per square meter.

16. A wire comprising a wire core with a surface, the wire core having a coating layer superimposed on the wire core surface, wherein
the wire core is a silver-based wire core, the silver-based wire core consisting of a silver-based material in the form of a doped silver, a silver alloy, or a doped silver alloy,
the coating layer is a double-layer comprised of a 1 to 100 nm thick inner layer of nickel or palladium and an adjacent 1 to 250 nm thick outer layer of gold,
the wire exhibits a total carbon content of ≤40 wt.-ppm,
the carbon content of the wire surface is in a range from 0.5 to less than 2.5 mg of carbon per square meter,
the outer layer of gold comprises at least one member selected from the group consisting of antimony, bismuth, arsenic and tellurium in a total proportion ranging from 10 to 100 wt.-ppm based on the weight of the wire, and
the at least one member selected from the group consisting of antimony, bismuth, arsenic and tellurium is present in the outer layer of gold in a concentration gradient that increases in a direction perpendicular to the longitudinal axis of the wire core.

17. A process for the manufacture of a wire according to claim 1, wherein the process comprises at least the steps (1) to (5):
(1) providing a silver-based precursor item,
(2) elongating the precursor item to form an elongated precursor item, until an intermediate cross-section in the range of from 706 to 31400 μm$^2$ or an intermediate diameter in the range of from 30 to 200 μm is obtained,
(3) applying a double-layer coating of an inner layer of nickel or palladium and an adjacent outer layer of gold on the surface of the elongated precursor item obtained after completion of process step (2), (4) further elongating the coated precursor item obtained after completion of process step (3) until a desired final cross-section or diameter and a double-layer comprised of an inner layer of nickel or palladium having a desired final thickness in the range of 1 to 100 nm and an adjacent outer layer of gold having a desired final thickness in the range of 1 to 250 nm is obtained, and (5) strand annealing the coated precursor obtained after completion of process step (4) at an oven set temperature in the range of from 200 to 600° C. for an exposure time in the range of from 0.4 to 0.8 seconds and quenching it to form the coated wire, wherein the application of the gold layer in step (3) is performed by electroplating it from a gold electroplating bath comprising gold.

* * * * *